(12) United States Patent
Wang

(10) Patent No.: US 11,200,029 B2
(45) Date of Patent: Dec. 14, 2021

(54) EXTENDABLE MULTIPLE-DIGIT BASE-$2^n$ IN-MEMORY ADDER DEVICE

(71) Applicant: FlashSilicon Incorporation, Diamond Bar, CA (US)

(72) Inventor: Lee Wang, Diamond Bar, CA (US)

(73) Assignee: FLASHSILICON INCORPORATION, Diamond Bar, CA (US)

( * ) Notice: Subject to any disclaimer, the term of this patent is extended or adjusted under 35 U.S.C. 154(b) by 56 days.

(21) Appl. No.: 16/850,825

(22) Filed: Apr. 16, 2020

(65) Prior Publication Data

US 2021/0326109 A1 Oct. 21, 2021

(51) Int. Cl.
*G06F 7/507* (2006.01)
*G06F 7/50* (2006.01)
*G11C 8/08* (2006.01)

(52) U.S. Cl.
CPC .............. *G06F 7/50* (2013.01); *G06F 7/507* (2013.01); *G11C 8/08* (2013.01)

(58) Field of Classification Search
CPC ....................................................... G06F 7/507
See application file for complete search history.

(56) References Cited

U.S. PATENT DOCUMENTS

| 6,161,164 A * | 12/2000 | Dhong | G06F 12/1027 |
|---|---|---|---|
| | | | 365/49.17 |
| 2016/0246571 A1* | 8/2016 | Walters, III | G06F 7/575 |
| 2018/0157621 A1* | 6/2018 | Shu | G06F 7/506 |
| 2019/0065148 A1* | 2/2019 | Lazer | G11C 15/04 |

* cited by examiner

*Primary Examiner* — Chuong D Ngo

(57) ABSTRACT

The base-$2^n$ in-memory adder device mainly comprises Perpetual Digital Perceptron (PDP) in-memory adder with Read Only Memory (ROM) arrays for storing the binary sum codes of the addition table for processing the addition operations of two n-bit binary integer operands. Since the integer numbers can be represented by the binary codes of multiple digits of base-$2^n$ integer numbers, the base-$2^n$ in-memory adder device can iterate multiple times of the digit-additions to complete the binary code addition for two m-digit base-$2^n$ integer operands. Consequently, the base-$2^n$ in-memory adder device can improve the computation efficiency and save the computation power by eliminating the data transportations between Arithmetic Logic Unit (ALU), registers, and memory units.

22 Claims, 19 Drawing Sheets

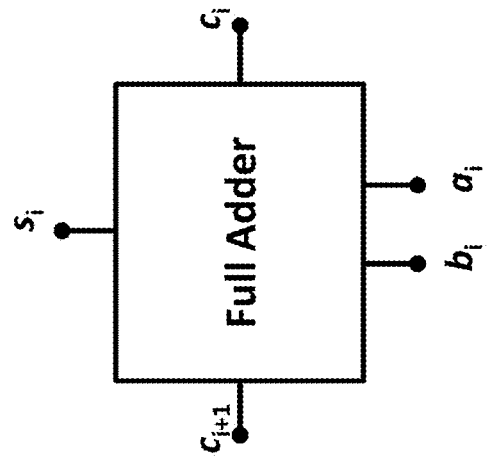
Fig. 2c (Prior Art)
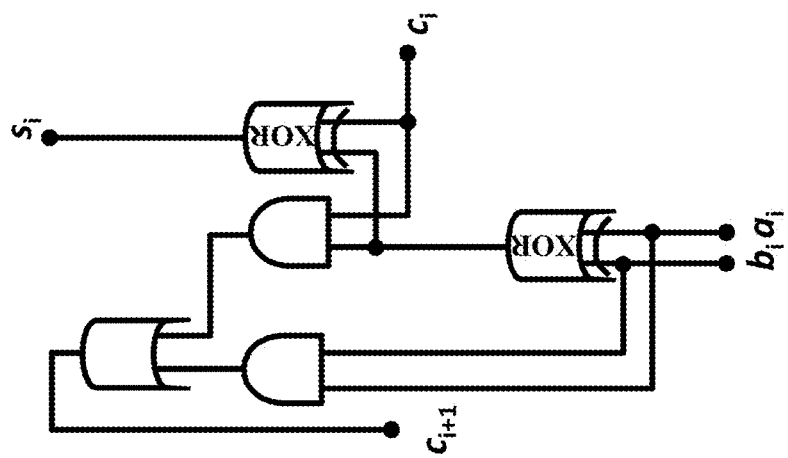
Fig. 2b (Prior Art)
Fig. 2a (Prior Art)
$a_i + b_i + c_i = (c_{i+1}s_i)_b$ n-bit by n-bit Addition Table : $S_i = A_i + B_i + C_i$

| $B_i$ \ $A_i$ | 0<br>00..00..00b | 1<br>00..00..01b | ... | $2^{n-1}-1$<br>01..11..11b | ... | $2^n-2$<br>11..11..10b | $2^n-1$<br>11..11..11b |
|---|---|---|---|---|---|---|---|
| 0<br>00..00..00b | 0<br>0 00..00..00b<br>0 00..00..01b | 1<br>0 00..00..01b<br>0 00..00..10b | ... | $2^{n-1}-1$<br>0 01..11..11b<br>0 01..11..00b | ... | $2^n-2$<br>0 11..11..10b<br>0 11..11..11b | $2^n-1$<br>0 11..11..11b<br>1 00..00..00b |
| 1<br>00..00..01b | 1<br>0 00..00..01b<br>0 00..00..10b | 2<br>0 00..00..10b<br>0 00..00..11b | ... | $2^{n-1}$<br>0 10..00..00b<br>0 10..00..01b | ... | $2^n-1$<br>0 11..11..11b<br>1 00..00..00b | $2^n$<br>1 00..00..00b<br>1 00..00..01b |
| ... | ... | ... | ... | ... | ... | ... | ... |
| $2^{n-1}-1$<br>01..11..11b | $2^{n-1}-1$<br>0 01..11..11b<br>0 10..00..00b | $2^{n-1}$<br>0 10..00..00b<br>0 10..00..01b | ... | $2^n-2$<br>0 11..11..10b<br>0 11..11..11b | ... | $2^n+2^{n-1}-2-1$<br>1 01..11..01b<br>1 01..11..10b | $2^n+2^{n-1}-2$<br>1 01..11..10b<br>1 01..11..11b |
| ... | ... | ... | ... | ... | ... | ... | ... |
| $2^n-2$<br>11..11..10b | $2^n-2$<br>0 11..11..10b<br>0 11..11..11b | $2^n-1$<br>0 11..11..11b<br>1 00..00..00b | ... | $2^n+2^{n-1}-2-1$<br>1 01..11..01b<br>1 01..11..10b | ... | $2^{n+1}-4$<br>1 11..11..00b<br>1 11..11..01b | $2^{n+1}-2-1$<br>1 11..11..01b<br>1 11..11..10b |
| $2^n-1$<br>11..11..11b | $2^n-1$<br>0 11..11..11b<br>1 00..00..00b | $2^n$<br>1 00..00..00b<br>1 00..00..01b | ... | $2^n+2^{n-1}-2$<br>1 01..11..10b<br>1 01..11..11b | ... | $2^{n+1}-2-1$<br>1 11..11..01b<br>1 11..11..10b | $2^{n+1}-2$<br>1 11..11..10b<br>1 11..11..11b |

Fig. 4

"2n-bit" Input Bus Lines

EXTENDABLE MULTIPLE-DIGIT BASE-$2^n$ IN-MEMORY ADDER DEVICE

BACKGROUND OF THE INVENTION

Field of the Invention

The invention is related to the binary in-memory adder device for two integer operands. Particularly in contrast to the conventional binary carry-chain adder, the new binary in-memory adder is organized in base-$2^n$ format for n>1 according to the arithmetical tables stored in the memory arrays for improving the computation efficiency and power. The base-$2^n$ in-memory adder device according to the arithmetic table can extend the addition operations for two multiple-digit base-$2^n$ integer operands with arbitrary large numbers of digits.

Description of the Related Art

In the modern Von Neumann computing architecture as shown in FIG. 1, the Central Process Unit (CPU) executes logic operations according to the instructions and data from the main memory. The CPU 10 includes a main memory 11, an arithmetic and logic unit (ALU) 12, an input/output equipment 13 and a program control unit 14. Prior to the computation process, the CPU 10 is set by the program control unit 14 to point to the initial address code for the initial instruction in the main memory. The digital data are then processed with the arithmetic and logic unit 12 according to the sequential instructions in the main memory 11 accessed by the clock-synchronized address pointer in the program control unit 14. The digital logic computation process for CPU 10 is synchronously executed and driven by a set of pre-written sequential instructions stored in the instruction memory unit.

In digital computer systems based on the Von Neumann computing architecture numbers are represented in the binary formats. For example, an integer number/in the n-bit binary format is given by $$I = b_{m-1}2^{m-1} + b_{m-2}2^{m-2} + \ldots + b_1 2^1 + b_0 = (b_{m-1}b_{m-2} \ldots b_1 b_0)b,$$

where $b_i = [0, 1]$ for $i = 0, \ldots, (m-1)$, and the symbol "b" indicates the integer number in the binary format.

The arithmetic operations such as multiplication, addition, subtraction, and division for integer numbers require manipulating the binary codes of the operant integer numbers to obtain the correct binary representation of the resultant integer numbers for the arithmetic operations. The manipulations of the operant binary codes include feeding the binary codes into the combinational logic gates and placing the operational code data in the correct positions of the registers and memory units in IC chips. Therefore the more manipulation steps of moving the binary codes in and out of various memory units, registers, and combinational gate logic units through their connecting bus-lines the more computing power is consumed. Specially, when the computing processor is operated at the bit-level manipulations of the code strings the power consumptions from charging and discharging the capacitances of the connecting bus-lines, the logic gates, the registers, and the memories will significantly increase with the increasing operational steps as the power $P \sim f \times C \times V_{DD}^2$, where f is the step cycles per process time period, C is the total associated charging/discharging capacitances for the entire computing process, and $V_{DD}$ is the high voltage supply. For example, the multiplication of two integer numbers represented by two n-bit binary codes is usually done by the so-called Multiply-Accumulation (MA) sequence: taking each single-bit of one "n-bit" operand to multiply ("AND" operation) with the other "n-bit" operand to obtain the "n" numbers of "n-bit" binary codes; shifting each "n-bit" binary code into the correct positions in the "n" rows of 2n-bit long registers; filling the empty bit registers with zeros for each row of the 2n-bit long registers; performing the "(n−1)" steps of addition operations for the "n" number of 2n-bit long code strings in the registers to obtain the multiplication 2n-bit long binary code string. The tedious steps of bit-level manipulations indeed increase the loading of computing processors. The heavy data traffics moving in and out of the memory units, logic gates, and registers as in the pipeline processing may also create the bus-line congestions for processors. The so-called Von Neumann bottleneck caused by the bus-line congestions of heavy data traffics is the main reason for slowing down the computation processes. Furthermore the more operational steps for the bit-level manipulations of computation processes the more numbers of instruction codes and temporary data are required to be stored in more memory spaces in IC chips.

In the main aspect of this invention, instead of applying Arithmetic Logic Unit (ALU) for the arithmetic computations as in the conventional computer chips based on the Von Neumann computing architecture, we apply memory arrays for direct arithmetic computations to reduce the frequencies of data transportations through the connecting bus-lines between ALUs, buffers, registers, memory units for saving the computing power and improving the computing efficiency.

In the U.S. patent application Ser. No. 16/675,554 (the disclosure of which is incorporated herein by reference in its entirety), the memory arrays storing the operational code information of the arithmetic tables are applied for the in-memory processors to achieve the "one-step" direct-computations by eliminating the multiple many steps of tedious bit-level manipulations between ALUs, buffers, registers, and memory units.

However, when the numbers of processing bits are scaled up to a large number "n", the numbers of table cells in the correspondent arithmetic tables are also scaled up by $2^{2n}$ cells. That is, every increasing number of bits from "n" to "(n+1)" would be the four times increase of the original numbers of table cells in the arithmetic table as ($2^{2(n+1)} = 4 \times (2^{2n})$). Therefore the sizes of memory arrays in the in-memory processors for large numbers of bits cannot be scaled up freely as the constrains of silicon costs for the areas of the in-memory processors in IC chips and the performance of processing speeds for the signal propagating delays inside the large memory arrays. To resolve the issue of scaling up large number of bits for the memory arrays, we would divide the large number of bits into multiple-digit base-$2^n$ arithmetic operations (n>1) such that the memory array sizes for the base-$2^n$ arithmetic tables still remain reasonably small resulting in properly small silicon areas and good enough processing speeds. The way we organize the large binary integer numbers in base-$2^n$ format for the arithmetic operations is similar to that a human applies the memorized single-digit arithmetic tables such as the single digit addition table: 0+0=0, . . . , 1+1=2, 1+2=3, . . . , 9+9=18 and the single digit multiplication table: 0×0=0, . . . , 1×1=1, 1×2=2, . . . , 9×9=81, to his/her addition and multiplication exercises for two multiple-digit decimal integer numbers.

In contrast to the in-memory approach of this invention, the conventional binary adders are all based on the combinational logic gates with various versions to improve the carry-bit propagation by looking ahead logic circuitries. FIG. 2a shows a logic table for a conventional binary full adder. FIG. 2b shows logic gate schematics for the binary full adder associated with FIG. 2a. FIG. 2c shows the symbol for the conventional two-operand bit-addition operation. The logic table for single-bit addition for a given "i" bit is verified with the equation $a_i+b_i+c_i=(c_{i+1}s_i)b$, where $a_i$ and $b_i$ are the two input bits of the operands, $c_i$ is the carry-bit from the previous bit addiction, $c_{i+1}$ is the present carry-bit, and $s_i$ is the sum bit. An m-bit ripple-carry adder can be constructed with a chain of "m−1" full adders 320 and one half adder 310 through the connections of carry bit $c_i$ nodes as shown in FIG. 3.

In another aspect of this invention, the in-memory adder device (e.g., FIG. 11) is extendable to arbitrary numbers of digits of the binary code addition operation, where the binary code addition operations can be performed digit by digit up to arbitrary numbers of digits by applying the base-$2^n$ in-memory adder multiple times of digits. The base-$2^n$ in-memory adder (e.g., FIG. 5) storing the operational code information of the addition table (e.g., FIG. 4) in base-$2^n$ format can be seen as the basic addition processing unit. The performed addition process is similar to that of people performing addition for two arbitrary digits of integer numbers digit by digit in the decimal format.

SUMMARY OF THE INVENTION

The integer number A with "m" digits in base-$2^n$ format is generally given by $$A=A_{m-1}X^{m-1}+A_{m-2}X^{m-2}+\ldots+A_1X^1+A_0X^0=(A_{m-1}A_{m-2}\ldots A_1A_0)x,$$

where $A_i$, for i=0, 1, . . . , (m−1), is the digit integer number given by the number in the integer number group of [0, 1, 2, . . . , ($2^n$−1)] and X=$2^n$.

Note that the symbol "x" indicates the number is in the base-$2^n$ format. The $i^{th}$ digit integer number A can be also given in the n-bit binary format as $A_i=(a_{i(n-1)}a_{i(n-2)}\cdots a_{i1}a_{i0})b$ and $a_{ij}=[0, 1]$ for j=0, 1, . . . , (n−1) according to the first column cells or the first row cells shown in the addition table in FIG. 4.

The addition sum integer number S for the two m-digit base-$2^n$ integer number operands (A and B) can be written as follows:

$$S=S_mX^m+S_{m-1}X^{m-1}+S_{m-2}X^{m-2}+\ldots+S_1X^1+S_0X^0,$$

$$A=A_{m-1}X^{m-1}+A_{m-2}X^{m-2}+\ldots+A_1X^1+A_0X^0,$$

$$B=B_{m-1}X^{m-1}+B_{m-2}X^{m-2}+\ldots+B_1X^1+B_0X^0.$$

According to the above equations, we then obtain the sum for the digit as $$S_m=C_m=[0,1] \text{ for } A_m=0 \text{ and } B_m=0,$$

and $S_i=A_i+B_i+C_i$ for i=0,1, . . . ,(m−1), where $C_i$=[0, 1] is the carry digit from the previous digit addition.

The digit addition operation is then performed according to the equation $S_i=A_i+B_i+C_i$. The digit addition table for $A_i+B_i+C_i$ with the carry digit $C_i$=0 and the digit addition table for $A_i+B_i+C_i$ with carry digit $C_i$=1 are shown the top and bottom codes in the correspondent cells in FIG. 4, respectively.

The memory arrays for the addition table in FIG. 4 can be implemented with the Perpetual Digital Perceptron (PDP) as disclosed in U.S. patent application Ser. No. 16/717,444 (the disclosure of which is incorporated herein by reference in its entirety) for the simplicity and compactness of the Read Only Memory (ROM) arrays. In FIG. 5 the PDP in-memory adder 500 applied for a base-$2^n$ in-memory adder device 100 (FIG. 11) comprises a "2n-bit" Input Buffer & Driver Unit 510, a series Content Read Only Memory (CROM) array 520, a Match detector unit 530, a Response Read Only Memory (RROM) array 540 and a "2-to-1" multiplexer 550.

FIG. 6 shows the schematic of the Input Buffer and Driver Unit 510 consisting of "2n-bit" data flip-flips 620 for storing the 2n-bit inputted data and "2n-bit" of two-stage inverter driver 630 for driving the voltage signals onto the search-lines 511. When the PDP in-memory adder 500 is enabled by the "Enb" with a high voltage signal $V_{OO}$ at node 505, the number "2n-bit" data flip-flops 620 receive the 2n-bit data voltage signals from "n-bit" data A and "n-bit" data $B_i$ by Input bus-lines 501 and 502, respectively. The two-stage inverter drivers 630 then drive the applied voltage signals onto the search-lines $SL_i$ and complementary search-lines $\overline{SL}_i$, for i=0, . . . , (2n−1), in the CROM array 520.

FIG. 7 shows the schematic of the 2n-bit by $2^{2n}$-row CROM array 520. Each CROM cell 710 consists of a complementary pair of NMOSFET (N-type Metal Oxide Semiconductor Field Effect Transistor) devices N1 and N2, and a switching NMOSFET device N3. The two drain electrodes 703 and 704 of the complementary NMOSFET devices N1 and N2 in one column of CROM cells 710 are respectively connected to form the search-line $SL_i$ and its complementary search-line $\overline{SL}_i$ in the vertical direction, for i=0, 1, . . . , (2n−1) columns. In each CROM cell 710, the common electrode 705 of the complementary NMOSFET devices N1 and N2 is connected to the gate of the switching NMOSFET device N3. The switching NMOSFET devices N3 in one row are connected in series to form a horizontal match-line $ML_k$, for k=0, 1, . . . , ($2^{2n}$−1) rows, in the CROM array 520. The left-hand end nodes 706 of all rows of the match-lines $ML_k$ are connected altogether to the ground voltage $V_{SS}$, while the right-hand end nodes 707 of each match-lines $ML_k$ are respectively connected to correspondent "k" match-detectors for k=0, 1, . . . , ($2^{2n}$−1), in the Match Detector Unit 530 through the match-lines 521. The digital voltage supply lines $V_{DD}$ and $V_{SS}$ run horizontally for each row of CROM cells 710 for the convenience of connection to the gates of the complementary NMOSFET devices N1 and N2 in the CROM cells 710. The gates of the complementary pair of NMOSFET device N1 and N2 in each cell 710 are respectively connected to the digital voltage rail lines ($V_{DD}$ and $V_{SS}$) by two metal contacts 701 (up right and down left) for storing datum "1", and to the digital voltage rail lines ($V_{DD}$ and $V_{SS}$) by two metal contacts 701 (down right and up left) for storing datum "0", as illustrated in the CROM cells 710 in the CROM array.

In FIG. 8, the Match Detector Unit 530 comprises a number $2^{2n}$ of match-detectors 81 for sensing the voltage potentials at nodes 811 connected to the match-lines 521 and a number $2^{2n}$ of flip-flops 82 for storing the matching status data of the match-lines 521. Each match-detector 81 consists of a high voltage supply PMOSFET device P1, an inverter $I_M$, and a charging capacitor $C_M$. When the match-detector 81 is activated by the "Enb" with a high voltage signal $V_{DD}$ at node 505, the high voltage supply PMOSFET device P1 is turned off to disconnect its correspondent match-line along with the capacitor node 811 from the high voltage rail $V_{DD}$. Since the matched match-line attached with the correspondent match-detector is discharged to the ground voltage potential, the voltage potential at node 811 will drop below the threshold voltage of the inverter $I_M$ to flip to the high voltage "$V_{DD}$" at the output node 821. While the voltage potentials at nodes 821 of the other inverters $I_M$ remain at the ground voltage $V_{SS}$ due to the remaining "high" voltage potentials at the gates above the inverters' flipping voltage at the nodes 811 accordingly with the effect of charge sharing between the "$V_{DD}$" voltage capacitor nodes 811 and the floating right-hand end nodes 707 of the un-matched match-lines in the match-lines 521. The output voltage signals of the inverters $I_M$ are then stored in the match-status flip-flops 82.

The high voltage signal $V_{DD}$ at the output node 822 of the matched match-status flip-flop for the correspondent match-detector 81 is then applied to activate the correspondent wordline in the $(2\times(n+1))$-bit by $(2^{2n})$-row RROM array 540 to output the voltage signals of the response $(2\times(n+1))$-bit code for both sets of the carry bit C plus "n" sum bits S with $C_i$=0 (top in the table cells) and the carry bit (C+1) plus "n" sum bits (S+1) with $C_i$=1 (bottom in the table cells) in the corresponding row cells of the RROM 540 according to the table in FIG. 4. On the other hand, the low voltage signals $V_{SS}$ at the output nodes 822 of the un-matched match-status flip-flops 82 deactivate the un-matched wordlines in the $(2\times(n+1))$-bit by $(2^{2n})$-row RROM array 540.

FIG. 9 shows the schematic of the $(2\times(n+1))$-bit by $(2^{2n})$-row RROM array 540. Each RROM cell 910 consists of an NMOSFET device N4. The gates 912 of the $k^{th}$ row of NMOSFET devices N4 are connected to form the wordline $WR_k$, for k=0, 1, . . . , $(2^{2n}-1)$. The digital voltage supply lines $V_{DD}$ and $V_{SS}$ run vertically for conveniently connecting the source electrodes 911 of the NMOSFET device N4 for each column of RROM cells 910. The drain electrodes 913 of the NMOSFET devices N4 for the entire column are connected to form the vertical lines to the output nodes 541 (C and $S_k$) and to the output nodes 542 ((C+1) and $(S+1)_k$), for k=0, . . . , (n−1). The voltage signals at the output nodes 541 and 542 for the "$2\times(n+1)$" columns are obtained from the voltage code signals passed by the row of NMOSFET devices N4 for the turned-on correspondent wordline $WR_k$. For storing the carry bit and the sum codes in the addition tables in FIG. 4 the source electrode 911 of the NMOSFET device N4 for each RROM cell 910 is connected to the vertical high digital voltage "$V_{DD}$" line for storing digital datum "1" and the vertical low digital voltage "$V_{SS}$" line for storing digital datum "0", by a metal contact 915, respectively. The $(2\times(n+1))$-bit response codes (carry bits and sum codes from addition table) are stored/hardwired in the $(2^{2n})$-rows of RROM cells 910 in RROM array 540. The correspondent wordline $WR_j$ is activated by the high voltage signal $V_{DD}$ from the correspondent match-detector 81 for each inputted operant data A (n-bit) and $B_i$ (n-bit) matched with a row of 2n-bit binary code in the CROM array 520.

FIG. 10 shows the schematic of "2-to-1" Multiplexer 550 comprising a number "$2\times(n+1)$" of Transmission Gates (TG) 1020 and an inverter 1010. The voltage signals at the (C, $S_{(n-1)}$, . . . , $S_0$) nodes and the voltage signals at the (C+1, $(S+1)_{(n-1)}$, . . . , $(S+1)_0$) nodes are respectively passed to the $(C_{i+1}, S_{i(n-1)}, \ldots, S_{i0})$ nodes based on the voltage signal (either "0" or "1") at the node $C_i$ by the "2-to-1" Multiplexer 550.

In summary, the basic operations of PDP in-memory adder 500 are as follows: when activated by the "Enb" with the high voltage signal $V_{DD}$ at node 505, the voltage signals of two inputted digital data from the bus-lines $A_i$ 501 and $B_i$ 502 are sent to the CROM array 520 for matching a row of stored binary codes in the CROM array 520 to generate the "high" voltage signal $V_{DD}$ from the correspondent match-detector 81 in the match detector unit 530. The correspondent match-detector 81 then turns on the selected wordline in the RROM array 540 to output the voltage signals of two response binary codes stored in the same row of RROM array for the binary codes of the correspondent cells in the addition table in FIG. 4. Therefore the binary codes (2n-bit long) for all possible combinations of two integer numbers ($A_i$ and $B_i$) are stored in CROM array 520 according to the first row on the top ($A_i$) or the first column on the left ($B_i$) of the n-bit by n-bit addition table in FIG. 4. Meanwhile two correspondent carry and sum binary codes in the correspondent table cell in FIG. 4 for the carry bit C and the "n" sum bits S with $C_i$=0 (top in the correspondent table cell) and the carry bit (C+1) and the "n" sum bits (S+1) with $C_i$=1 (bottom in the correspondent table cell) are stored in the same correspondent row of RROM array 540, respectively. When two inputted numbers ($A_i$ and $B_i$) with the binary codes of $(b_{i(n-1)}b_{i(n-2)} \ldots b_{i1}b_{i0}a_{i(n-1)}a_{i(n-2)} \ldots a_{i1}a_{i0})b$ are matched with a row of code stored in the CROM array 520, the RROM array 540 will simultaneously respond with the voltage signals of the $(2\times(n+1))$-bit code (C, $S_{(n-1)}$, $S_{(n-2)}$, . . . , $S_1$, $S_0$, C+1, $(S+1)_{(n-1)}$, $(S+1)_{(n-2)}$, . . . , $(S+1)_1$, $(S+1)_0$)b from the correspondent row for the addition operation of $A_i+B_i+C_i$ for $C_i$=0 and 1. Then, the "2-to-1" Multiplexer 550 selectively outputs either the voltage signals of carry and sum bits for $C_i$=0 or the voltage signals of carry and sum bits for $C_i$=1, at the $(C_{i+1}, S_{i(n-1)}, \ldots, S_{i0})$ nodes. According to the one-to-one mapping of CROM array 520 and RROM array 540 for the addition table cells, the numbers of rows for both memory arrays (CROM and RROM) are $(2^{2n})$-rows as the same number of cells in the n-bit by n-bit addition table in FIG. 4. Basically the functions of CROM array 520 and the match detector unit 530 are like the table cell pointer that simultaneously points to the correspondent table cell in FIG. 4 to selectively output either the binary code of the carry bit and sum bits for $C_i$=0 or the binary code of the carry bit and sum bits for $C_i$=1, stored in the RROM array 540.

FIG. 11 shows the schematic of the base-$2^n$ in-memory adder device 100 for two m-digit base-$2^n$ integer operands. The base-$2^n$ in-memory adder device 100 comprises the PDP base-$2^n$ in-memory adder 500 shown in FIG. 5, the "m-digit×n-bit" registers A 110 and the "m-digit×n-bit" registers B 120 for the two inputted integer operands shown in FIG. 12, the "m-to-1" input multiplexer 130 (FIG. 13) for selecting the $i^{th}$ digit of the two operands with 2n-bit long binary codes of $A_i$ and $B_i$ for each i=0, 1, 2, 3, . . . , (m−1) to the PDP base-$2^n$ in-memory adder 500 for the addition operation, the "1-to-m" output multiplexer 140 (FIG. 14) for selecting the $i^{th}$ digit of the n-bit long sum code to the $i^{th}$ digit location (for each i=0, 1, 2, . . . , (m−1)) in the sum register S 150, a sum register S 150 (FIG. 15) for storing binary code of the sum integer number and the final carry bit $S_m/C_m$ from the last $(m-1)^{th}$ addition operation, and a single-bit gated register C 160 (FIG. 16) for storing the carry-bit of each digit addition operations.

Each of the operant registers A 110 and registers B 120 comprises a number (m-digit×n-bit) of flip-flops 121 shown in FIG. 12. When the voltage signal Din at node 1211 is activated with the high digital voltage $V_{DD}$, the registers A and B are storing with the binary codes of the two operands ready for the addition operation. The "m-to-1" input multiplexer 130 comprising "2×m×n" columns and "m" rows of NMOSFET device 131 shown in FIG. 13 is for selecting two digits of two "n-bit" operant nodes from the "2×m×n" nodes for the connections to the PDP base-$2^n$ in-memory adder 500. The $i^{th}$ row of NMOSFET devices 131 for the $i^{th}$ digit is turned on for the connections by applying SW; with the high voltage signal $V_{DD}$ at the node 118(i). The "1-to-m" output multiplexer 140 comprising "(m×n)" columns and "m" rows of NMOSFET device 141 shown in FIG. 14 is for selecting sum nodes of each digit addition for the connections from the PDP base-$2^n$ in-memory adder 500 to the sum register S 150. The $i^{th}$ row of NMOSFET devices 141 for the $i^{th}$ digit is turned on for the connections by applying $SW_i$ with the high voltage signal $V_{DD}$ at the node 118(i). The sum register S 150 comprising a number "m-digit×n-bit" of flip-flops 151 and 1 carry digit "$S_m$" flip-flop 152 is shown in FIG. 15. The single-bit gated register C 160 comprising four NAND gates 166, a NOR logic gate 165 and two inverters 164 of the standard gated "D" flip-flop is shown in FIG. 16. The single-bit gated register C 160 is initially reset to zero with "Clr" "in a high voltage state $V_{DD}$" at node 161 for the first digit addition operation with $C_0$=0. When the "Enb" node is activated with the high voltage signal $V_{DD}$ at node 505 each time, the output voltage of the register C 160 at the node 163 for C; is read to the PDP base-$2^n$ in-memory adder 500 for the addition operation. At the same time the voltage signals of $C_{i+1}$ outputted from the PDP base-$2^n$ in-memory adder 500 is prohibited to write to the register C 160 during the time with "Enb" node having a high voltage signal $V_{DD}$ to prevent the unwanted voltage signal looping between $C_i$ and $C_{i+1}$.

The base-$2^n$ in-memory adder 100 for two m-digit base-$2^n$ integer operands is operated as follows: (1) The binary codes of the two "m-digit×n-bit" integer numbers A and B in the base-$2^n$ format are stored in the binary register A 110 and B 120 accordingly and meanwhile the register C 160 is reset to zero for the $0^{th}$ digit addition operation; (2) the input multiplexer 130 and output multiplexer 140 are set for the $0^{th}$ digit addition operation for $SW_0$ with the high voltage $V_{DD}$, the base-$2^n$ in-memory adder device 100 is activated for the addition operation with the "Enb" node having a high voltage signal $V_{DD}$; (3) After the completion of the first digit addition operation with the "Enb" node having a low voltage signal $V_{SS}$, the input multiplexer 130 and the output multiplexer 140 are set for the next digit addition operation for SW; with the high voltage signal $V_{DD}$ for i=0, 1, 2, . . . , (m−1); (4) Repeat the addition operations from the $0^{th}$ digit to the last (m−1)$^{th}$ digit until the addition of two m-digit base-$2^n$ integer numbers is completed. Note the carry bit $C_m/S_m$ from the last (m−1)$^{th}$ addition operation is set for the most significant digit location in the sum register S 150 by turning on the NMOSFET device 102 for $SW_{m-1}$ with the high voltage signal $V_{DD}$ in FIG. 11.

BRIEF DESCRIPTION OF THE DRAWINGS

For a better understanding of the present invention and to show how it may be carried into effect, reference will now be made to the following drawings, which show the preferred embodiment of the present invention, in which:

FIG. 2a shows a logic table for a full adder.

FIG. 2b shows logic gate schematics for the full adder associated with FIG. 2a.

FIG. 2c shows the symbol for the conventional two-operand bit addition operation.

FIG. 4 shows an n-bit by n-bit addition table for two n-bit binary integer number operands with the carry bit $C_i$=0 (top in the cell) and the carry bit $C_i$=1 (bottom in the cell).

FIG. 18 shows the binary code for the 4-digit hexadecimal addition table associated with the 4-digit hexadecimal in-memory adder device in FIG. 17.

DETAILED DESCRIPTION OF THE INVENTION

The following detailed description is meant to be illustrative only and not limiting. It is to be understood that other embodiment may be utilized and element changes may be made without departing from the scope of the present invention. Also, it is to be understood that the phraseology and terminology used herein are for the purpose of description and should not be regarded as limiting. Those of ordinary skill in the art will immediately realize that the embodiments of the present invention described herein in the context of methods and schematics are illustrative only and are not intended to be in any way limiting. Other embodiments of the present invention will readily suggest themselves to such skilled persons having the benefits of this disclosure.

To illustrate the idea of m-digit base-$2^n$ in-memory adder for two m-digit base-$2^n$ integer number operands, we apply 4-digit base-$2^4$ (hexadecimal) in-memory adder device for two 16-bit (i.e., 4-digit×4-bit) binary integer number operands for the illustrated embodiment. The embodiment is for the illustration purpose but shall not be limited to specific numbers of m and n depending on the optimized design environment circumstance for the IC chips.

Figure 1:
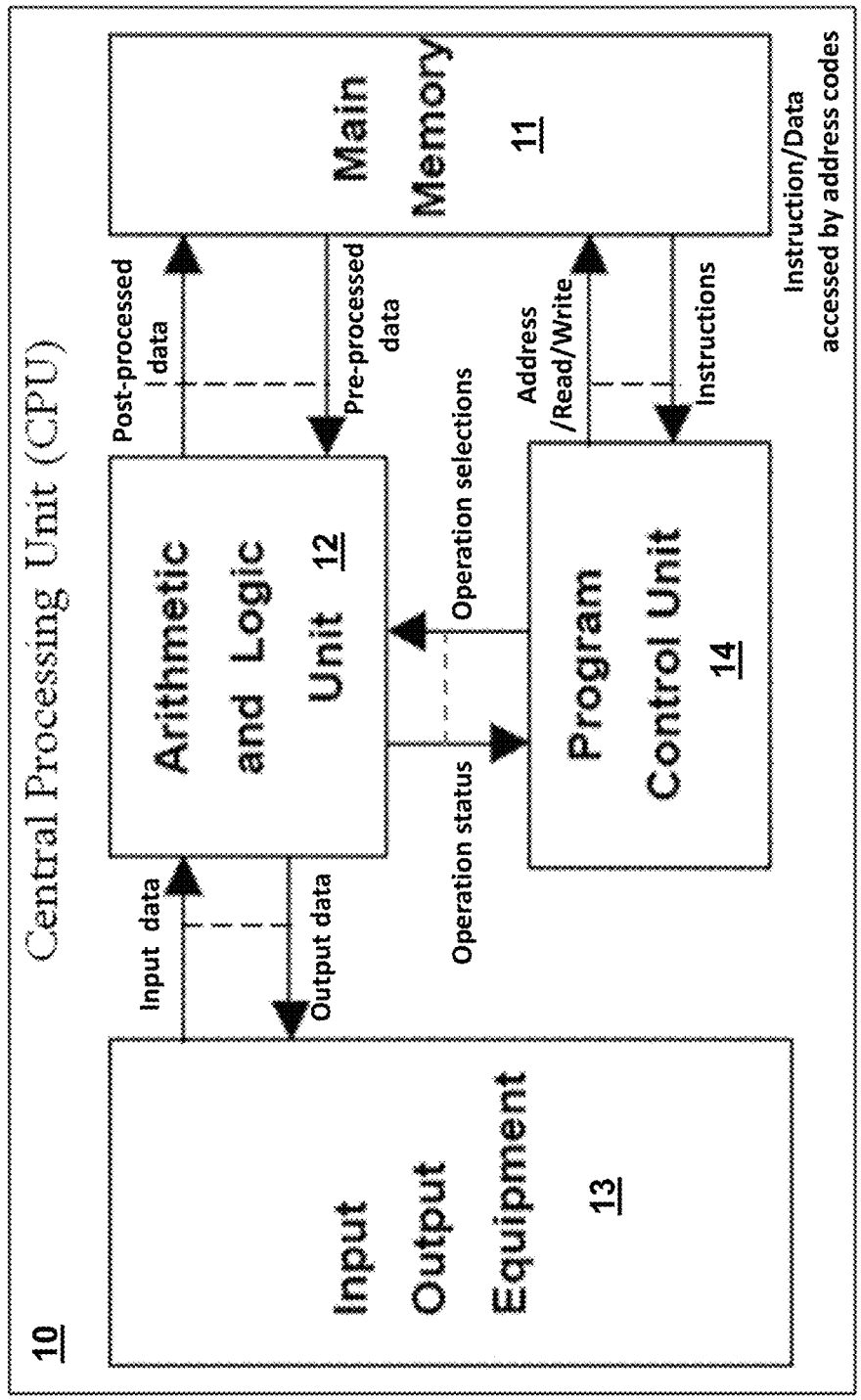
FIG. 1 shows the conventional Von-Neumann computing architecture for a typical Central Processing Unit (CPU).
Figure 3:
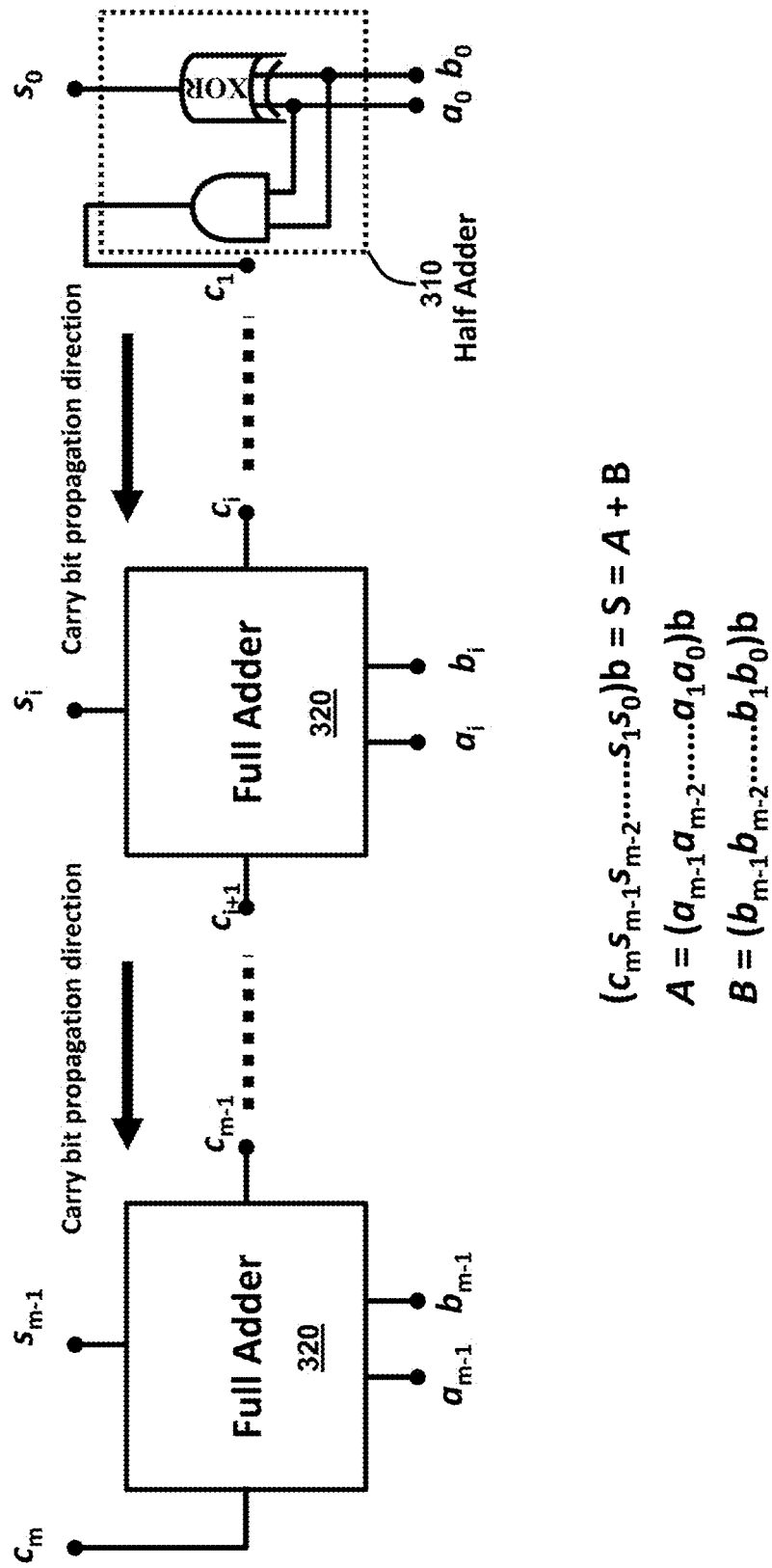
FIG. 3 shows the schematics of the conventional m-bit ripple-carry adder comprising a chain of "m-1" binary full adders and a binary half adder.
Figure 5:
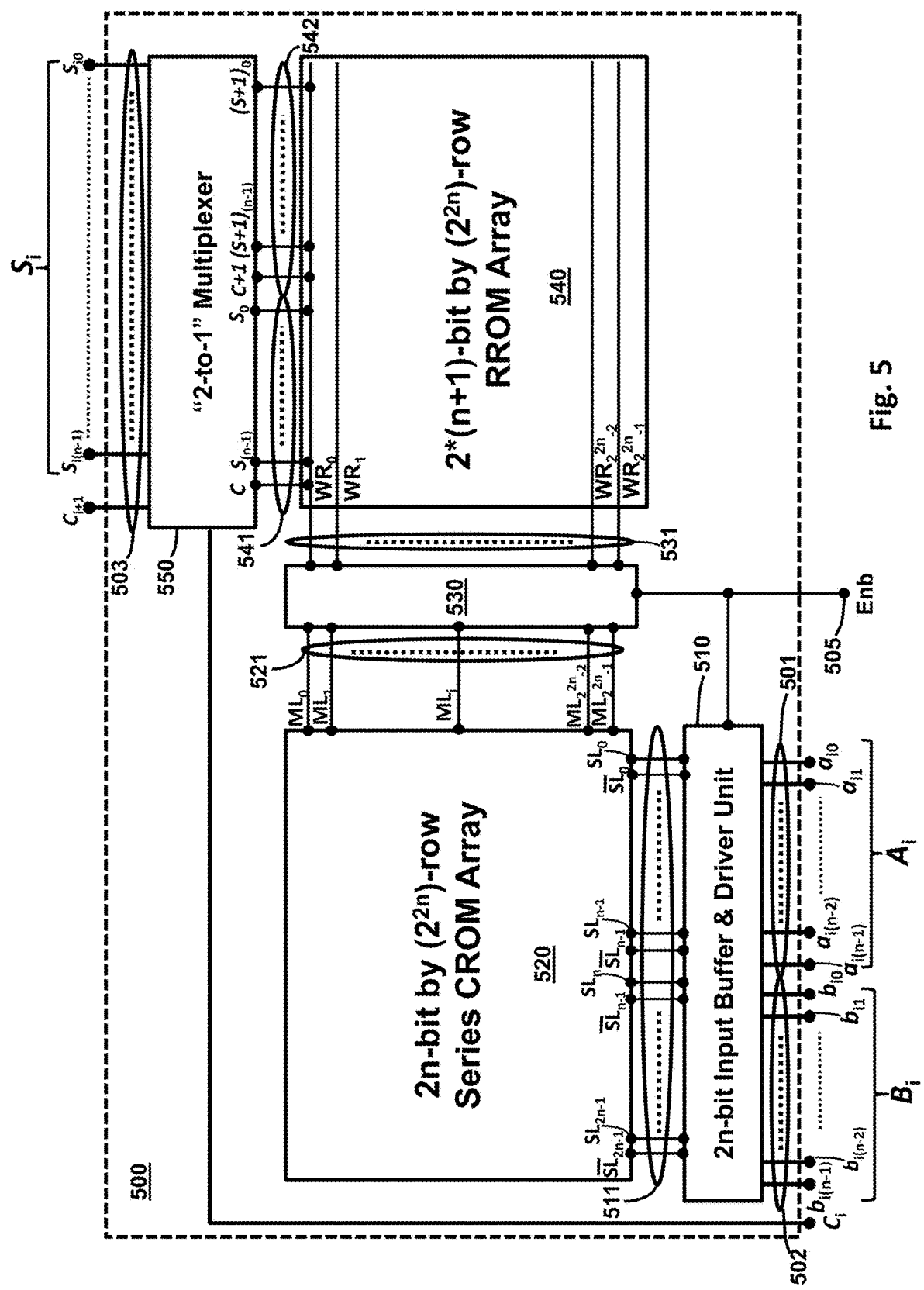
FIG. 5 shows the schematics of Perpetual Digital Perceptron (PDP) base-$2^n$ in-memory adder applied for the single-digit addition of the two m-digit base-$2^n$ integer numbers according to an embodiment of the invention.
Figure 6:
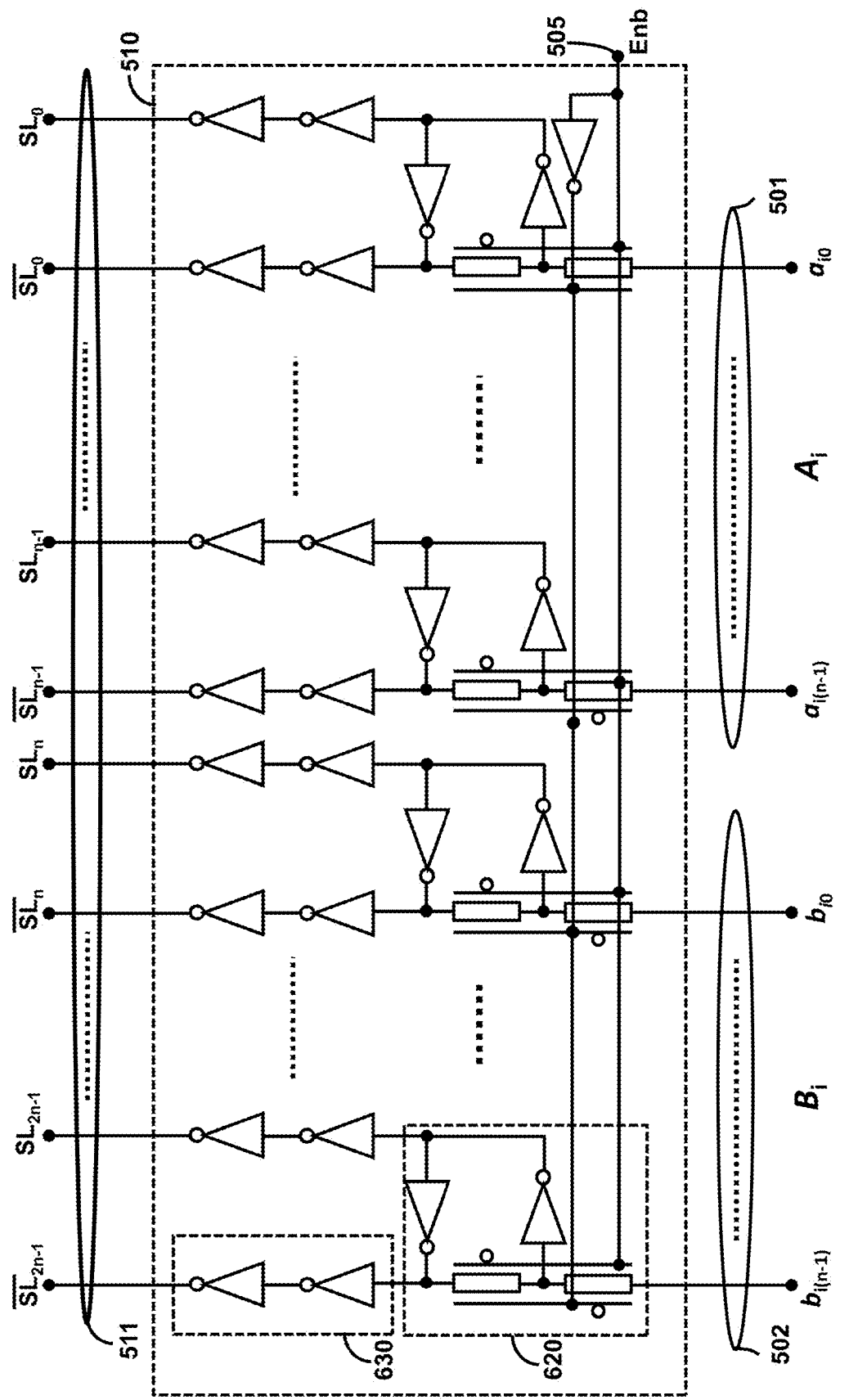
FIG. 6 shows the schematic of the Input Buffer and Driver Unit in the PDP in-memory adder in FIG. 5.
Figure 7:
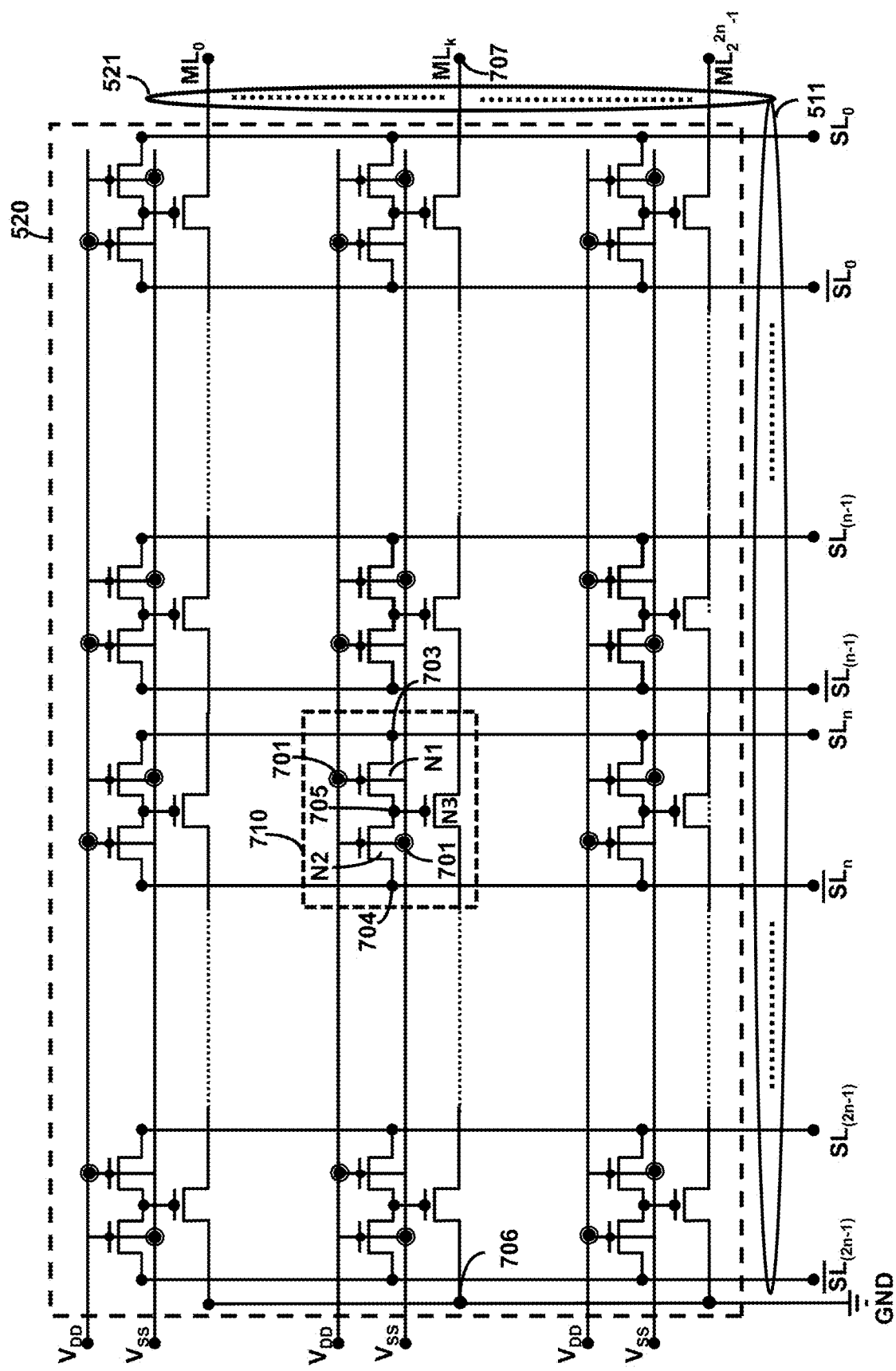
FIG. 7 shows the schematic of 2n-bit by ($2^{2n}$)-row CROM array in the PDP in-memory adder in FIG. 5.
Figure 8:
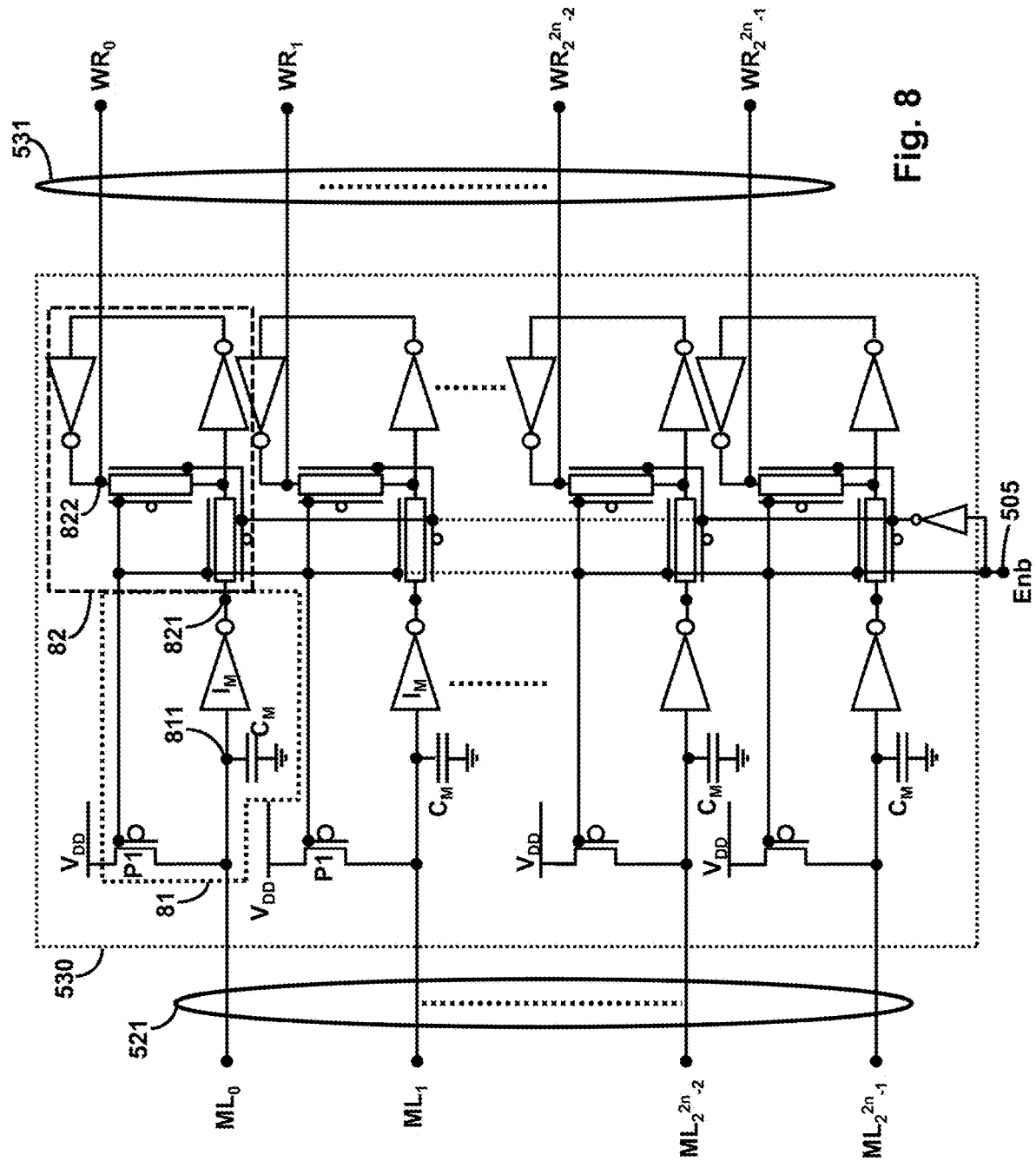
FIG. 8 shows the schematics of Match-Detector Unit in the PDP in-memory adder in FIG. 5.
Figure 9:
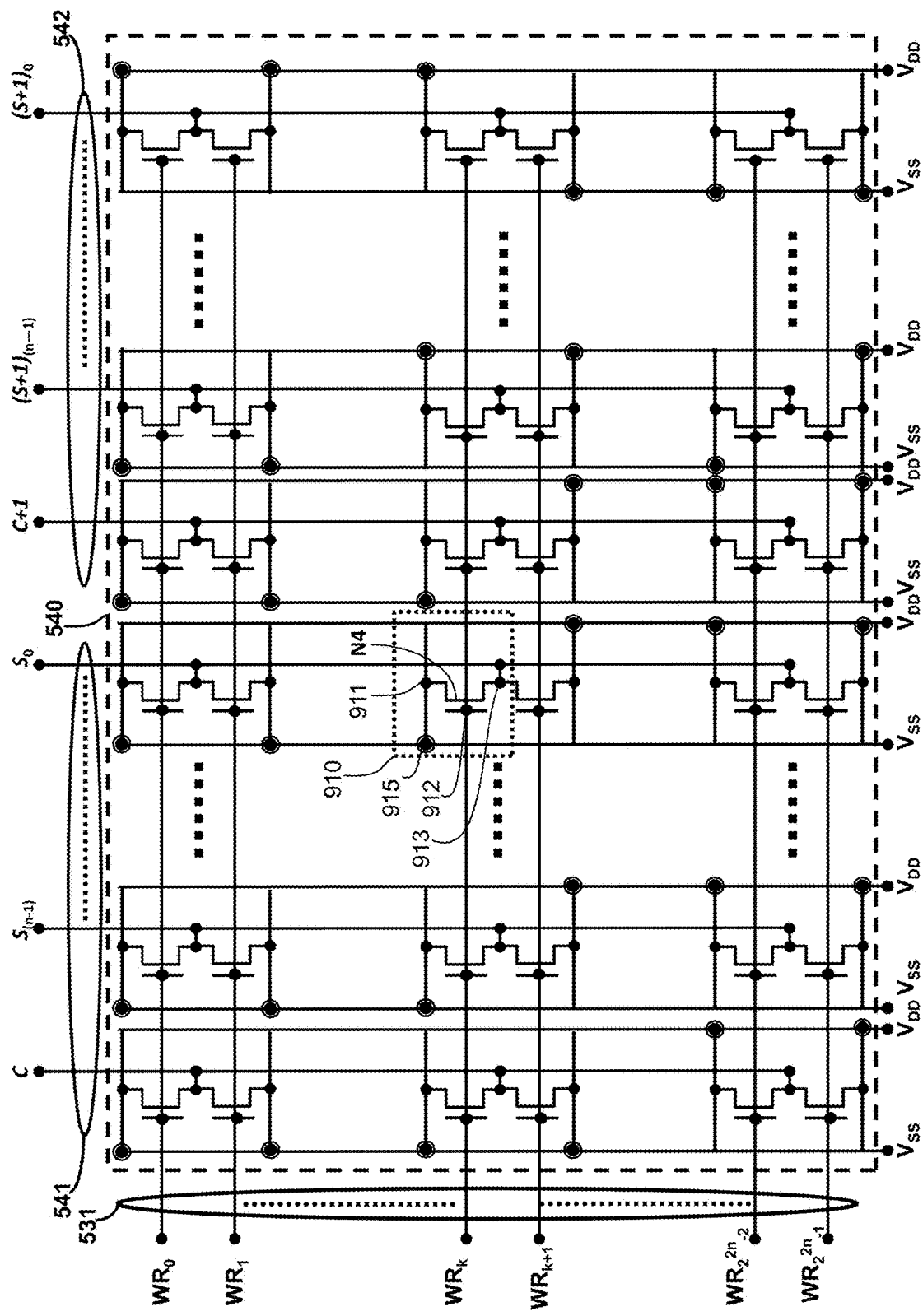
FIG. 9 shows the schematic of the (2×(n+1))-bit by ($2^{2n}$)-row RROM array in the PDP in-memory adder in FIG. 5.
Figure 10:
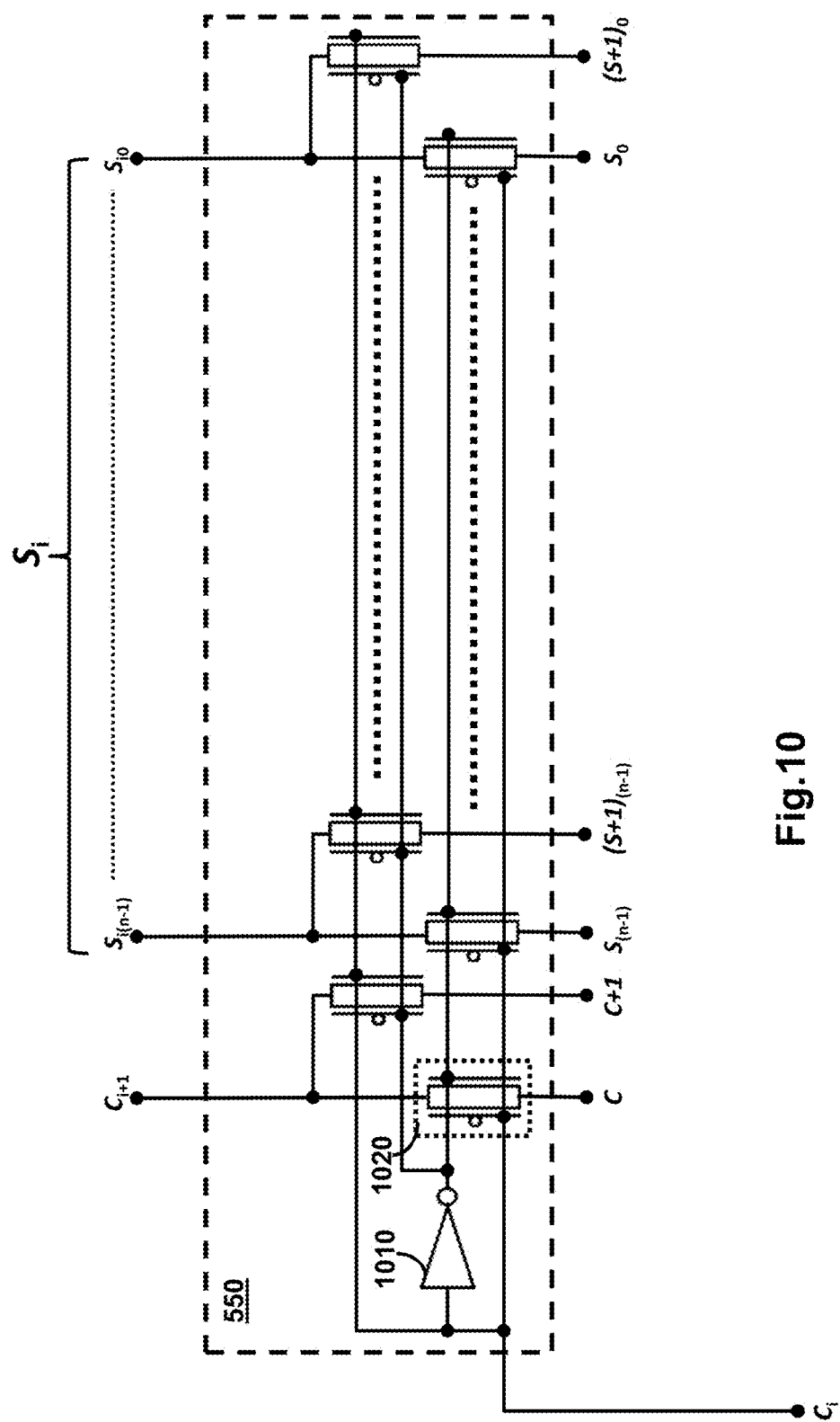
FIG. 10 shows the schematic of the "2-to-1" multiplexer in the PDP in-memory adder of FIG. 5 for selecting the outputs of sum codes for carry bit=0 and carry bit=1.
Figure 11:
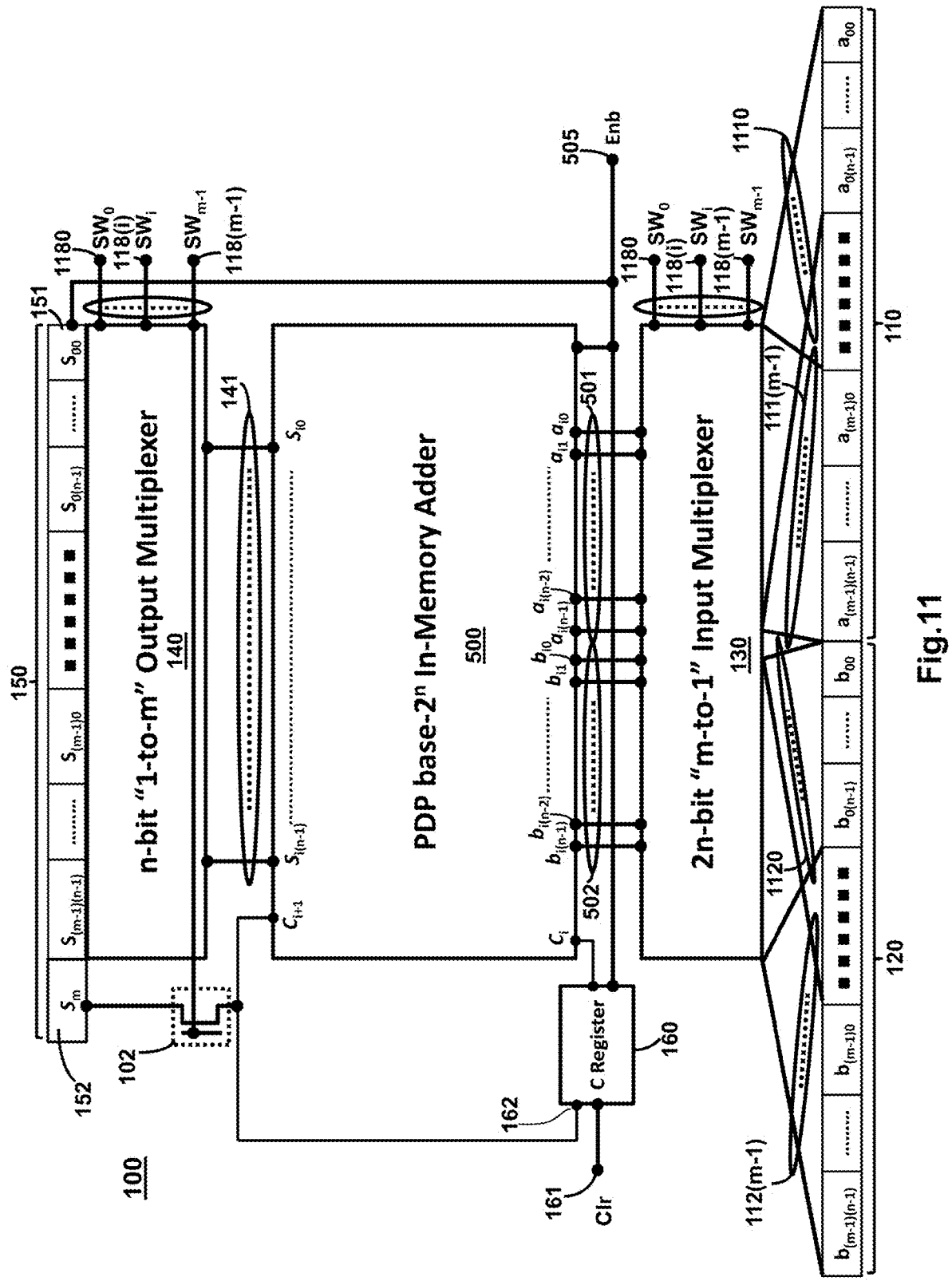
FIG. 11 shows the schematics of the base-$2^n$ in-memory adder device for two m-digit base-$2^n$ integer numbers according to an embodiment of the invention.
Figure 12:
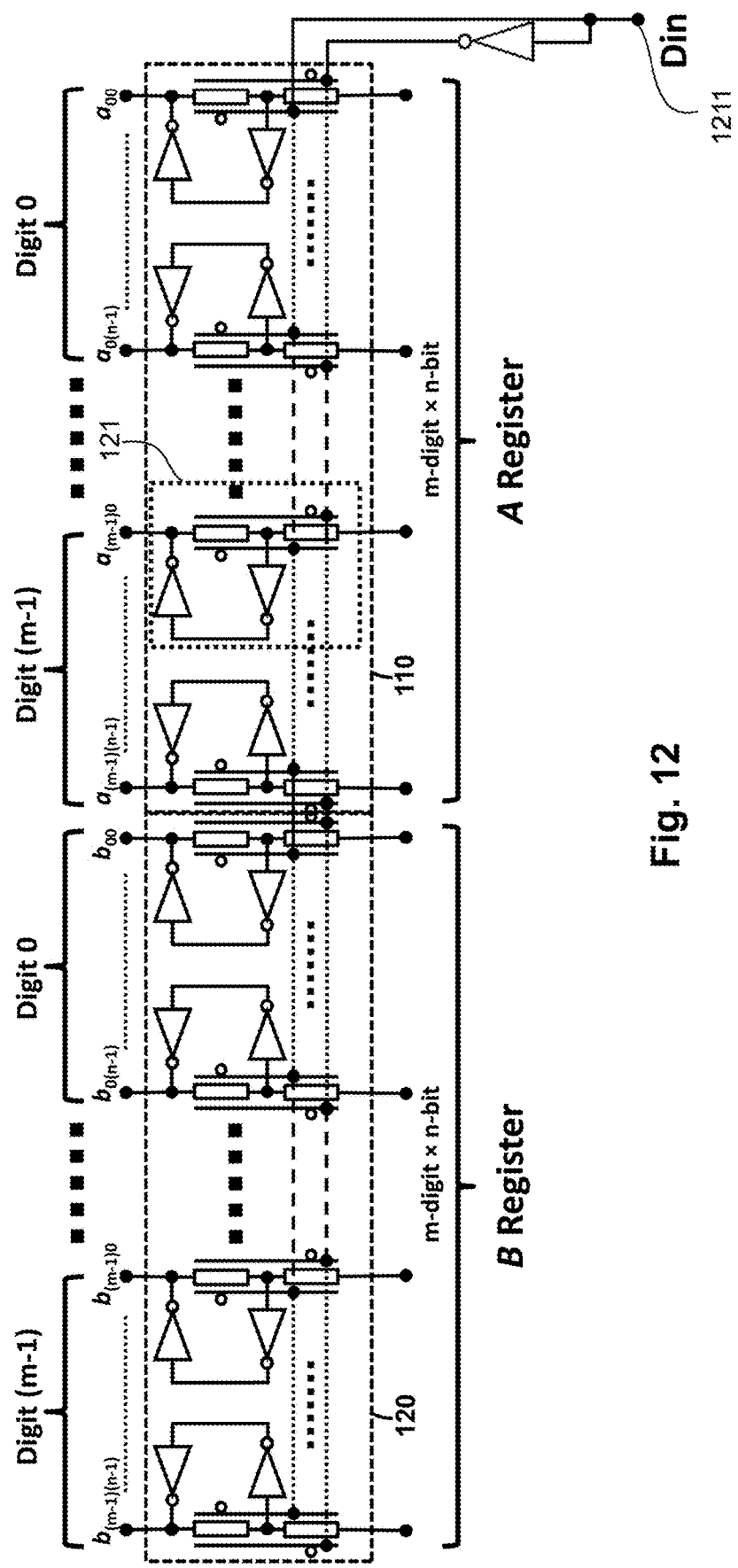
FIG. 12 shows the schematics of a number "m-digit×n-bit" of binary registers for the integer number A, and a number "m-digit×n-bit" of binary registers for the integer number B associated with the base-$2^n$ in-memory adder device in FIG. 11.
Figure 13:
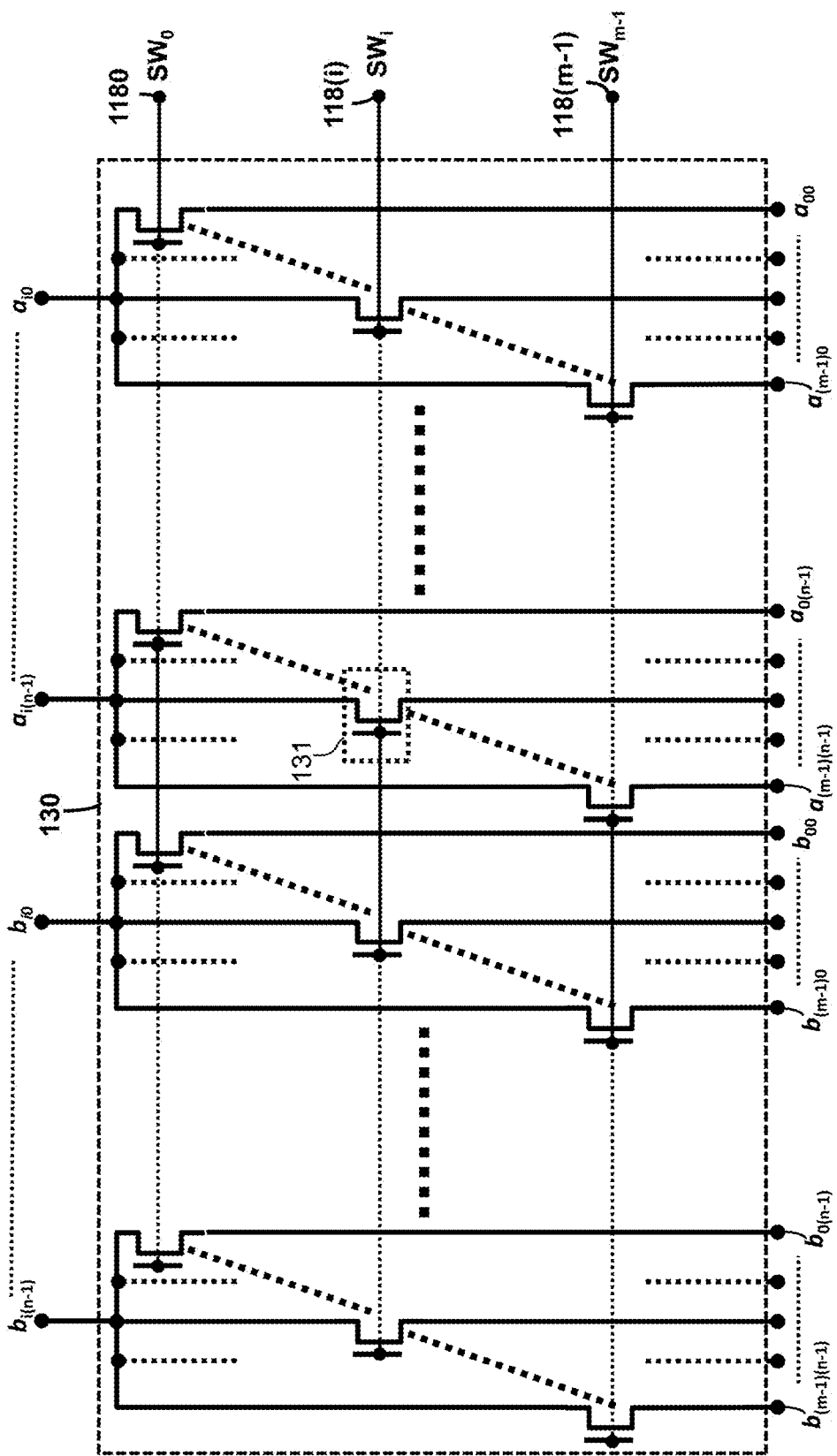
FIG. 13 shows the schematic of "m-to-1" input multiplexer for connecting the nodes of each digit of A register and B register to the input nodes of the PDP base-$2^n$ in-memory adder in FIG. 11 for the single-digit binary addition operation.
Figure 14:
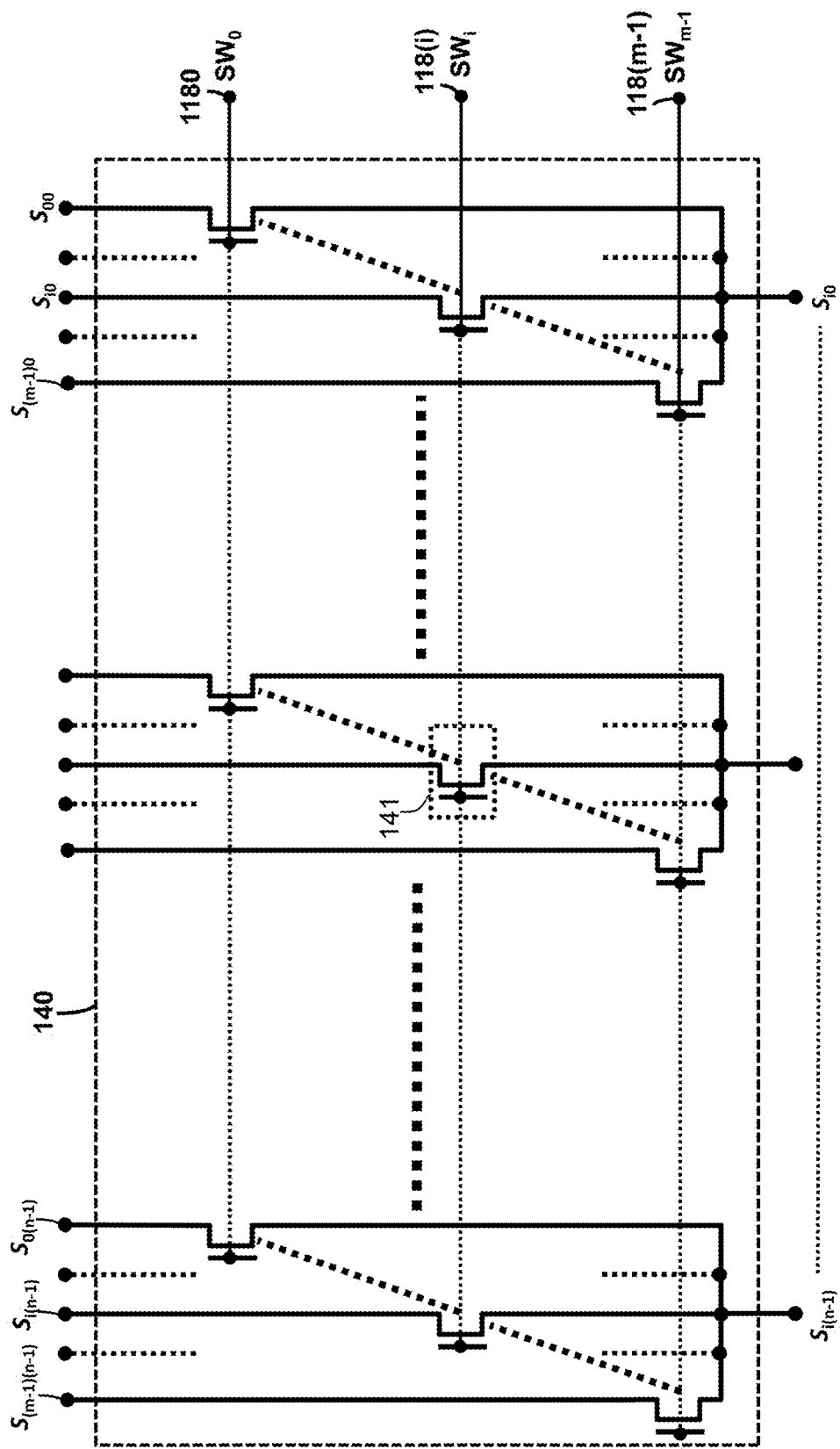
FIG. 14 shows the schematic of "1-to-m" output multiplexer for selecting the output nodes of the PDP base-$2^n$ in-memory adder 500 in FIG. 11 to the input nodes of the sum S register 150.
Figure 15:
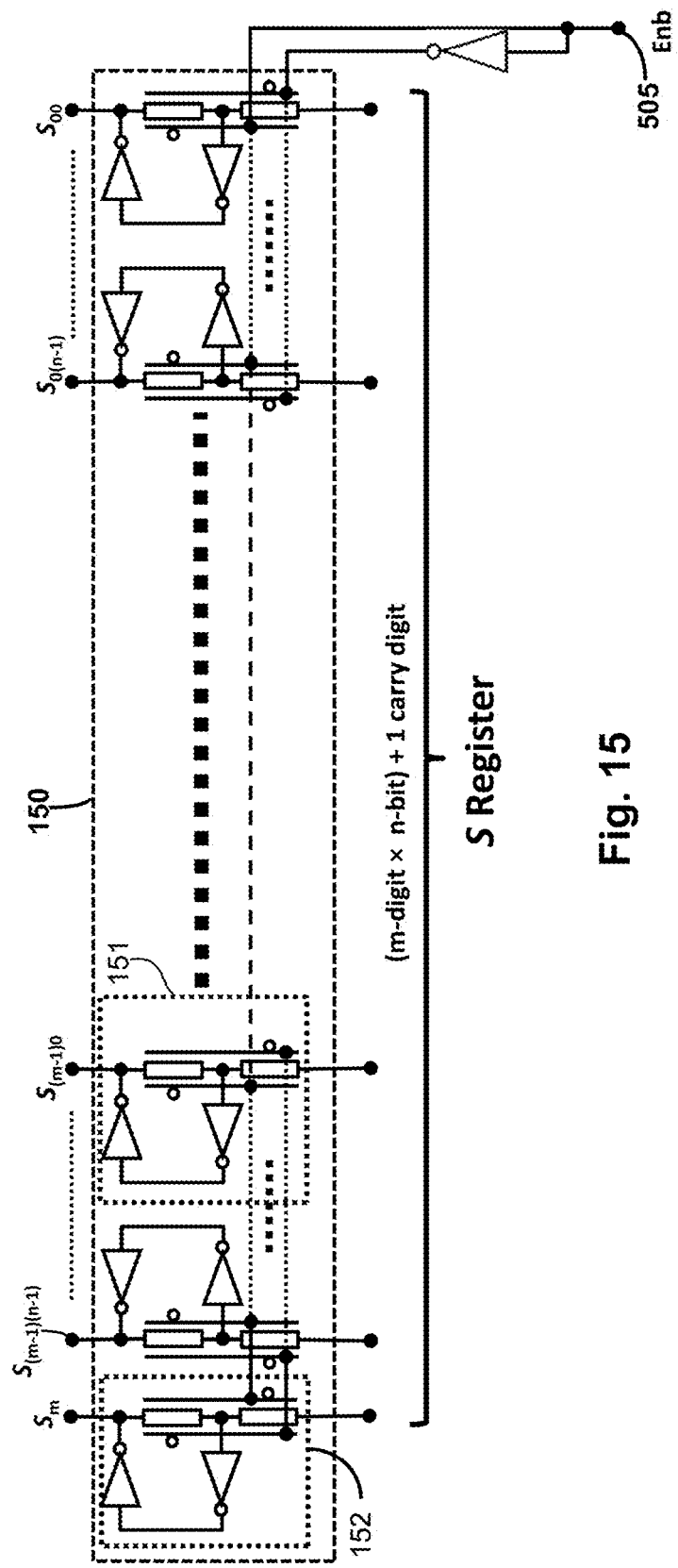
FIG. 15 shows the schematic of the number "(m-digit× n-bit)+1" of binary registers for the sum register S 150 associated with the base-$2^n$ in-memory adder device in FIG. 11.
Figure 16:
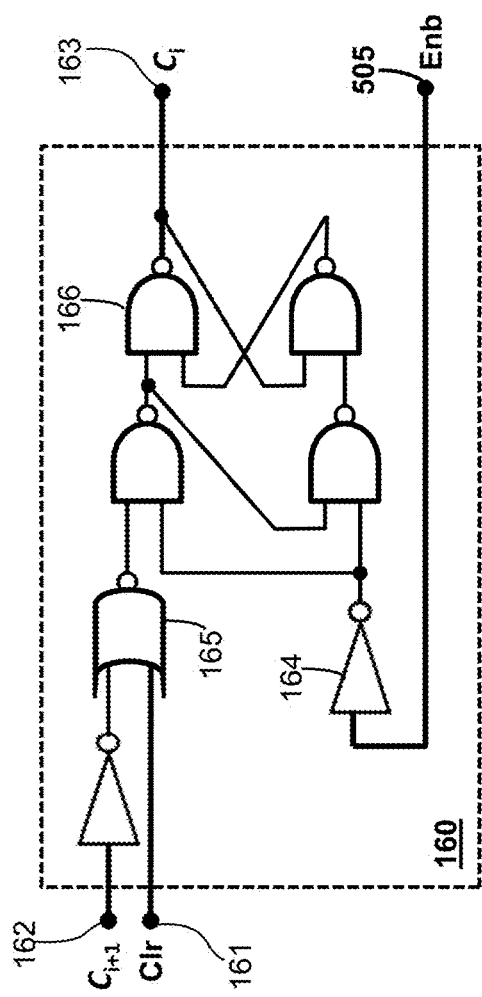
FIG. 16 the schematic of gated register C 160 associated with the base-$2^n$ in-memory adder device in FIG. 11 for storing the carry bit for each digit addition operation.
Figure 17:
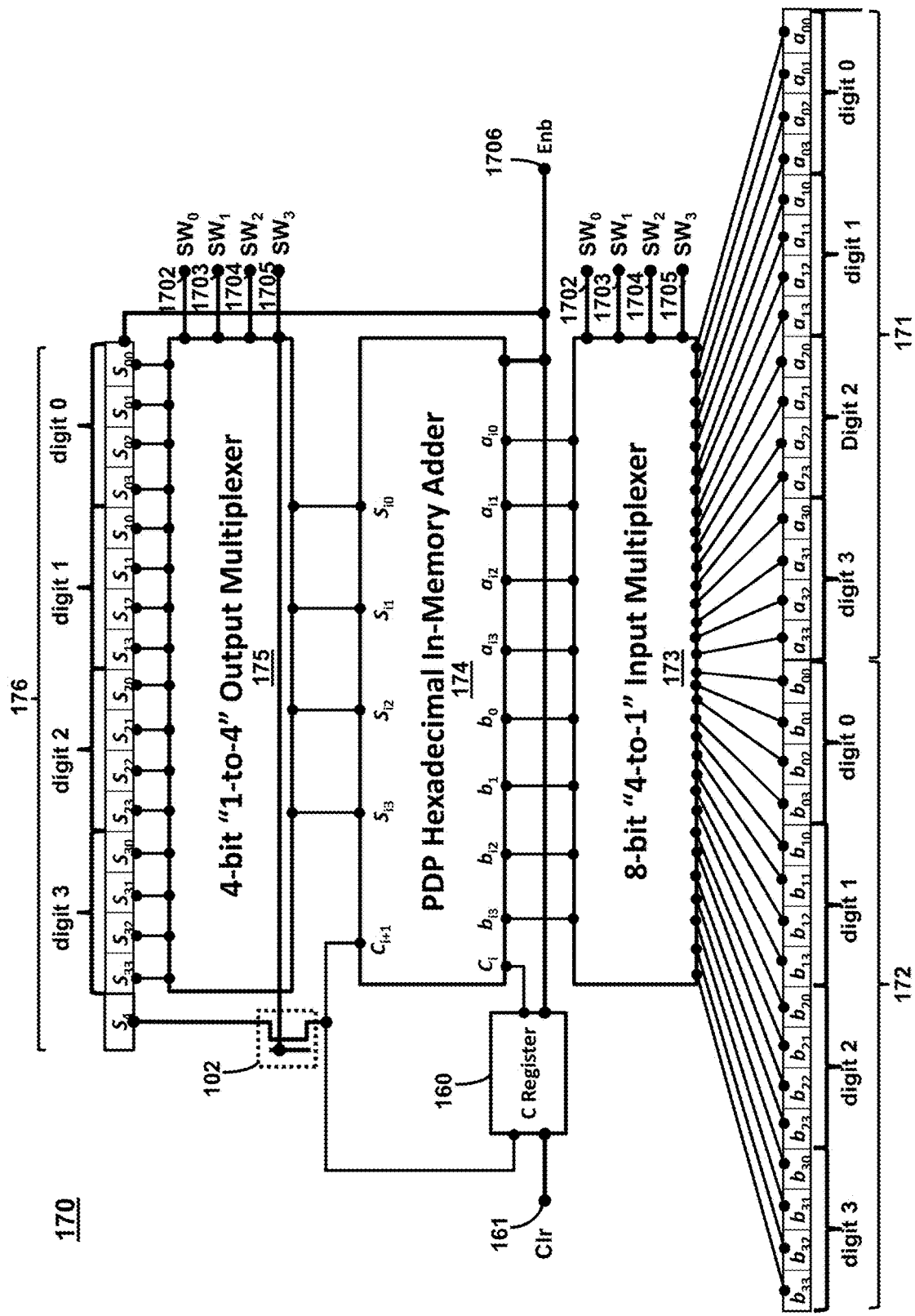
FIG. 17 shows the schematics of the 4-digit hexadecimal in-memory adder device according to an embodiment of the invention.
Figure 18:
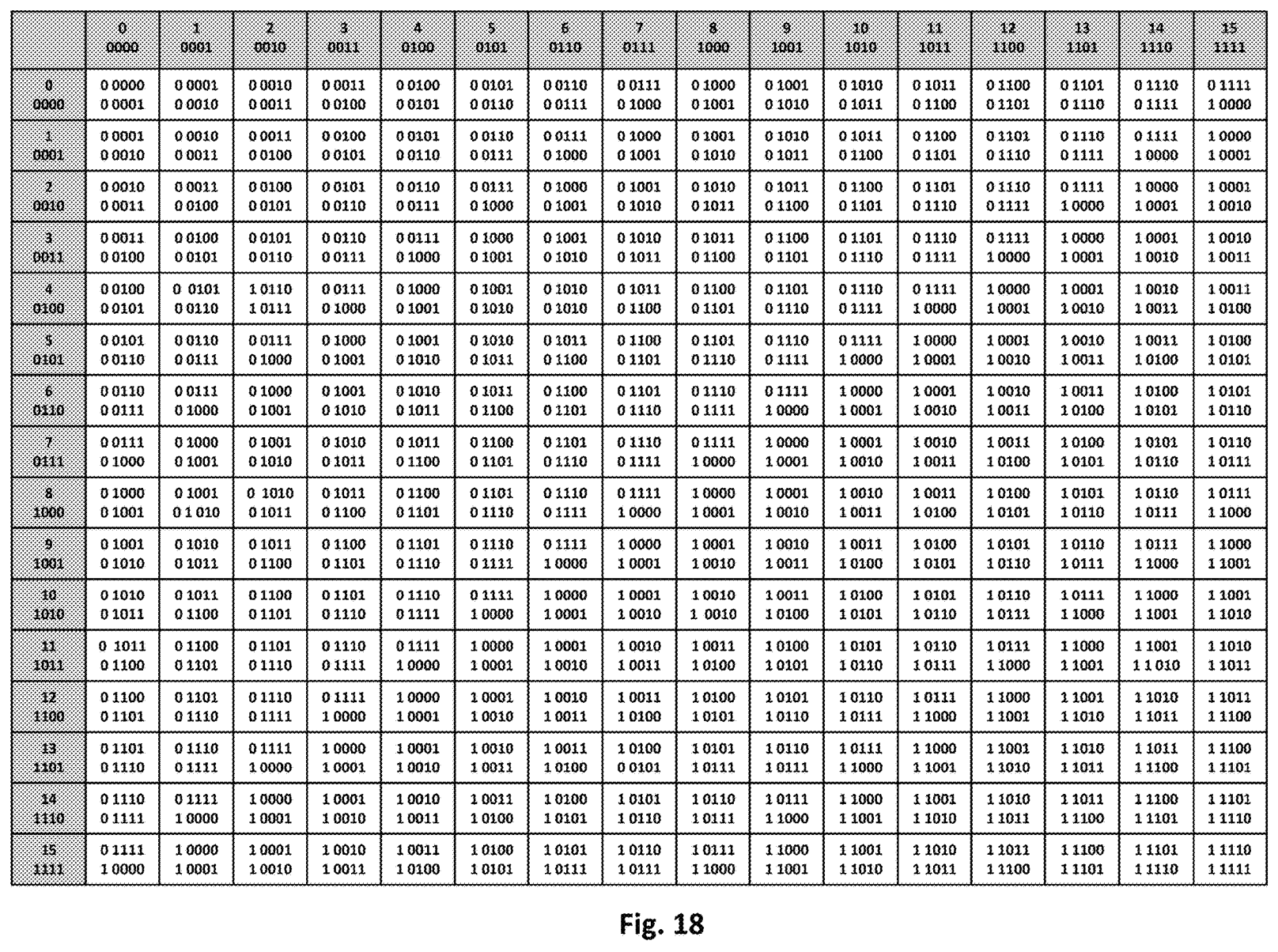

The schematic of the 4-digit hexadecimal in-memory adder device 170 is shown in FIG. 17. The 4-digit hexadecimal in-memory adder device 170 comprises an 16-bit binary operant register A 171 and an 16-bit binary operant register B 172 for storing the binary codes of the two 4-digit hexadecimal integer numbers, an 8-bit "4-to-1" Input Multiplexer 173 for selecting the binary codes of each digit of $A_i$ and $B_i$, a PDP Hexadecimal In-Memory Adder 174 for storing the sum codes of the 4-bit by 4-bit addition table shown in FIG. 18, a 4-bit "1-to-4" Output Multiplexer 175 for selecting the digit of the binary sum code $S_i$ to the sum S Register 176, a 17-bit sum S register 176 for storing the 16-bit binary sum code plus the carry digit/bit, $S_4/C_4$ from the addition operations, and a gated flip-flop C register 160 for storing the processing carry-bit of each digit addition.

Figure 19:
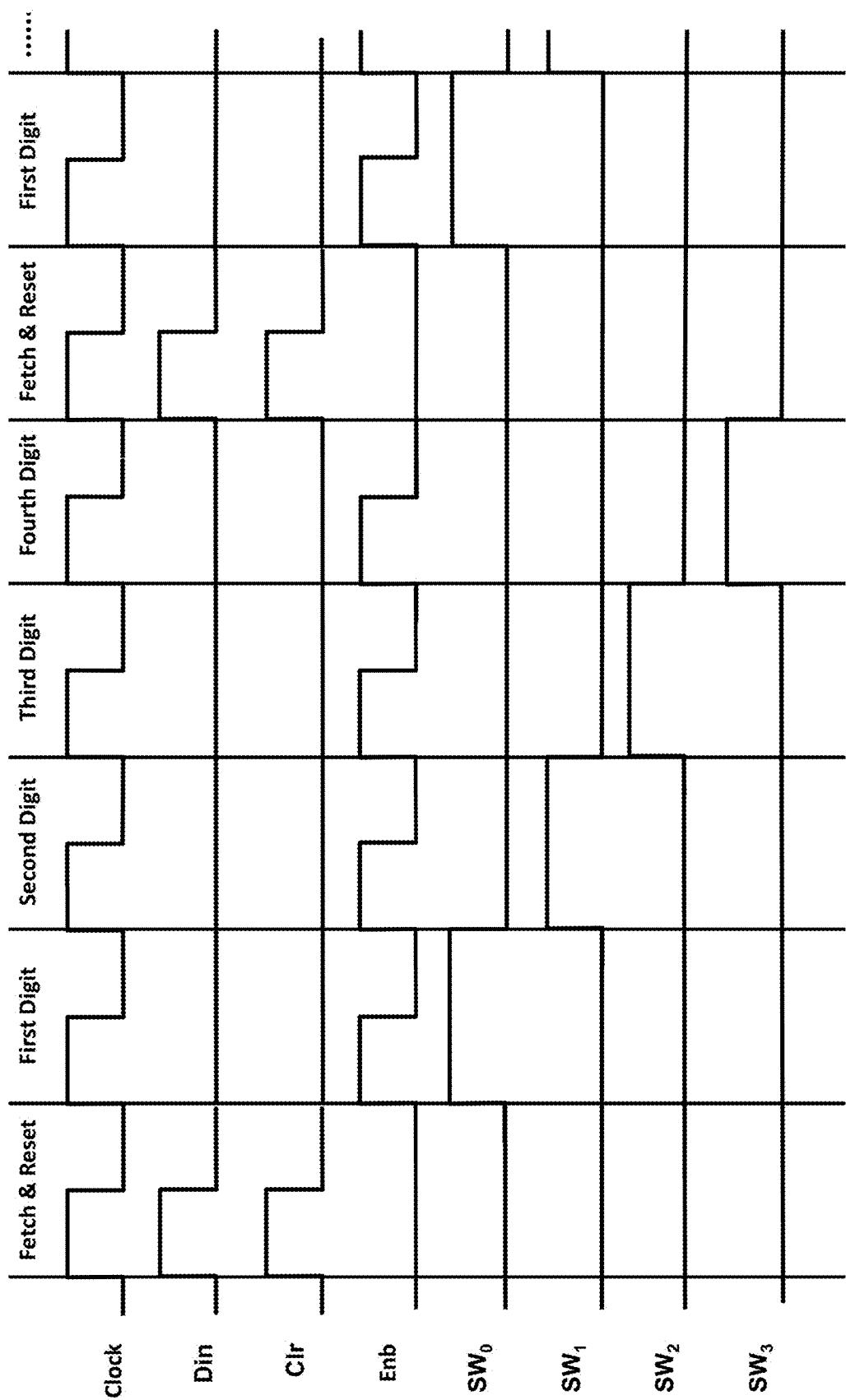
FIG. 19 shows the operational timing sequence for the 4-digit hexadecimal in-memory adder device in FIG. 17.

FIG. 19 shows the operational timing sequence for the 4-digit hexadecimal in-memory adder device 170 in the embodiment. In the first clock cycle, the voltage signals of the two 16-bit integer number operands for the addition operation are fetched into the 16-bit binary register A 171 and register B 172, respectively. At the same time cycle the processing carry-bit C register 160 is reset to zero by the "Clr" with the high voltage signal $V_{DD}$ for the first digit operation. For the first half of the second clock cycle, the first digit addition is processed by setting "$SW_0$" and "Enb" with the high voltage signal $V_{DD}$ for activating the in-memory adder device 170, while for the second half of the second clock cycle for "Enb" with the low voltage signal $V_{SS}$, the voltage signals of the binary code for the sum of the first digit addition are stored in the first digit location (4 bits) in the sum register 176 and the carry-bit C register 160 is set to the digital value of $C_1$. For the first half of the third clock cycle, the second digit addition is processed by setting "$SW_1$" and "Enb" with the high voltage signal $V_{DD}$ for activating the in-memory adder device 170, while for the second half of the third clock cycle for "Enb" with the low voltage signal $V_{SS}$ the voltage signals of the binary code for the sum of the second digit addition are stored in the second digit location (4 bits) in sum register 176 and the carry-bit C register 160 is set to the digital value of $C_2$. For the first half of the fourth clock cycle, the third digit addition is processed by setting "$SW_2$" and "Enb" with the high voltage signal $V_{DD}$ for activating the in-memory adder device 170, while for the second half of the fourth clock cycle for Enb with the low voltage signal $V_{SS}$, the voltage signals of the binary code for the sum of the third digit addition are stored in the third digit location (4 bits) in sum register 176 and the carry-bit C register 160 is set to the digital value of $C_3$. For the first half of the fifth clock cycle, the fourth digit addition is processed by "$SW_3$" and "Enb" with the high voltage signal $V_{DD}$ for activating the in-memory adder device 170, while for the second half of the fifth clock cycle for "Enb" with the low voltage signal $V_{SS}$, the voltage signals of the binary code for the sum of the fourth digit addition are stored in the fourth digit location (4 bits) in sum register 176 and at the same time the voltage signals of the carry-bit $C_4$ is also stored in the carry-digit flip-flop $S_4$ of the 17-bit register S 176 (i.e., the most significant bit in the 17-bit register S 176). The hexadecimal in-memory adder device 170 can repeat the procedure for five clock cycles to complete the additions of two 16-bit binary integer operands.

The aforementioned description of the preferred embodiments of the invention has been presented for purposes of illustration and description. It is not intended to be exhaustive or to limit the invention to the precise form or to exemplary embodiment disclosed. Accordingly, the description should be regarded as illustrative rather than restrictive. The embodiment is chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An in-memory adder device for performing digit-by-digit addition on a first operand and a second operand to generate a final sum result and a final carry digit, wherein each of the first operand, the second operand and the final sum result has m digits in base $2^n$, the in-memory adder device comprising:
    an in-memory adder configured to perform addition of two n-bit digits respectively selected from the first operand and the second operand based on each of m cycles of a first control signal, comprising:
    a first read-only-memory (ROM) array comprising ($2^n$× $2^n$) rows by 2n columns of first memory cells for parallel comparing the two selected n-bit digits with a number ($2^n$×$2^n$) of 2n-bit content symbols hardwired in the ($2^n$×$2^n$) rows of first memory cells to cause one row of the first memory cells to assert a match signal when the two selected n-bit digits match its hardwired 2n-bit content symbol;
    a second ROM array comprising ($2^n$×$2^n$) rows by (2×(n+ 1)) columns of second memory cells and generating a corresponding pair of (n+1)-bit sum values according to an asserted match signal, wherein ($2^n$×$2^n$) pairs of (n+1)-bit sum values of an addition table are respectively hardwired in the ($2^n$×$2^n$) rows of second memory cells; and
    a first multiplexer to output a n-bit sum code and a carry-out bit selected from one of the corresponding pair of (n+1)-bit sum values according to a carry-in bit at each of the m cycles; and
    a storage element configured to receive the carry-out bit at a current cycle and provide the carry-out bit as the carry-in bit at its next cycle;
    wherein a number m of n-bit sum codes obtained at the end of the m cycles form the final sum result.

2. The in-memory adder device according to claim 1, which performs the digit-by-digit addition starting from the least significant digit of the first operand and the second operand.

3. The in-memory adder device according to claim 1, wherein n-bit augends and n-bit addends of the addition table defines the 2n-bit content symbols.

4. The in-memory adder device according to claim 1, wherein one of the corresponding pair of (n+1)-bit sum values is associated with the carry-in bit equal to 0 while the other of the corresponding pair of (n+1)-bit sum values is associated with the carry-in bit equal to 1.

5. The in-memory adder device according to claim 1, further comprising:
a first operand register coupled to the first ROM array for storing the first operand; and
a second operand register coupled to the first ROM array for storing the second operand.

6. The in-memory adder device according to claim 5, further comprising:
a second multiplexer coupled between the first ROM array, the first and the second operand registers to retrieve the two selected n-bit digits from a same selected digit location in the first and the second operand registers according to a second control signal.

7. The in-memory adder device according to claim 1, further comprising:
a sum register coupled to the first multiplexer, wherein a most significant bit location in the sum register stores the carry-out bit derived from a most significant digit addition as the final carry digit and the rest of locations in the sum register store the final sum result.

8. The in-memory adder device according to claim 7, further comprising:
a third multiplexer coupled between the first multiplexer and the sum register to selectively connect the output of the first multiplexer to a corresponding digit location in the sum register according to a second control signal corresponding to the two selected n-bit digits.

9. The in-memory adder device according to claim 1, wherein the storage element is reset to output the carry-in bit of 0 prior to the m cycles of the first control signal.

10. The in-memory adder device according to claim 1, further comprising:
a switch device configured to store the carry-out bit from the first multiplexer into the most significant bit location in the sum register in response to a second control signal corresponding to two most significant digits respectively selected from the first operand and the second operand.

11. The in-memory adder device according to claim 1, wherein the in-memory adder comprises:
a detection circuit to respectively apply a number ($2^n \times 2^n$) of switching signals to a number ($2^n \times 2^n$) of wordlines of the second ROM array in response to a number ($2^n \times 2^n$) of match signals from the first ROM array at each of the m cycles;
wherein the detection circuit activates a corresponding switching signal based on the asserted match signal, and wherein while receiving an activated switching signal, a corresponding row of second memory cells is switched on to output its hardwired pair of (n+1)-bit sum values.

12. An operating method of an in-memory adder device, the in-memory adder device comprising an in-memory adder and a storage element, the in-memory adder comprising a first read-only-memory (ROM) array and a second ROM array, the first ROM array comprising ($2^n \times 2^n$) rows by 2n columns of first memory cells, the second ROM array comprising ($2^n \times 2^n$) rows by ($2 \times (n+1)$) columns of second memory cells, wherein ($2^n \times 2^n$) pairs of (n+1)-bit sum values of an addition table are respectively hardwired in the ($2^n \times 2^n$) rows of second memory cells, the method comprising the steps of:
providing two n-bit digits respectively selected from a first operand and a second operand for the first ROM array;
parallel comparing the two selected n-bit digits with a number ($2^n \times 2^n$) of 2n-bit content symbols hardwired in the ($2^n \times 2^n$) rows of first memory cells to cause one row of the first memory cells to assert a match signal when the two selected n-bit digits match its hardwired 2n-bit content symbol;
outputting one pair of (n+1)-bit sum values according to an asserted match signal by the second ROM array;
selecting one from the one pair of (n+1)-bit sum values as a n-bit sum code and a carry-out bit according to a carry-in bit from the storage element;
receiving the carry-out bit by the storage element at a current cycle of m cycle of a control signal; and
repeating steps of providing, comparing, outputting, selecting and receiving until all the digits of the first operand and the second operand are processed to obtain a final sum result and a final carry digit;
wherein each of the first operand, the second operand and the final sum result has m digits in base $2^n$; and
wherein a number m of n-bit sum codes obtained at the end of the m cycles form the final sum result.

13. The method according to claim 12, further comprising:
resetting the storage element to cause the carry-in bit to be equal to 0 prior to all the steps.

14. The method according to claim 12, wherein the step of providing comprises:
respectively retrieving the two selected n-bit digits from a same digit location in a first operand register and a second operand register based on ascending order of digit numbers of the first and the second operands;
wherein the in-memory adder device further comprises the first operand register storing the first operand and the second operand register storing the second operand.

15. The method according to claim 12, further comprising:
providing the carry-in bit by the storage element at the current cycle before the step of selecting;
wherein the carry-in bit is a carry-out bit previously received by the storage element at a cycle previous to the current cycle.

16. The method according to claim 12, further comprising:
storing the n-bit sum code in a corresponding digit location in a sum register after the step of selecting and prior to the step of repeating;
wherein the in-memory adder device further comprises the sum register.

17. The method according to claim 16, further comprising:
storing the carry-out bit as the final carry digit in a most significant bit location of the sum register after the step of repeating.

18. The method according to claim 12, further comprising:
respectively applying a number m of switching signals to a number m of wordlines in the second ROM array according to a number ($2^n \times 2^n$) of match signals from the first ROM array prior to the step of outputting and after the step of comparing.

19. The method according to claim 18, wherein the step of outputting comprises:
  switching on a row of second memory cells to output its corresponding pair of (n+1)-bit sum values in response to a received activated switching signal; and
  switching off a row of second memory cells in response to a received de-activated switching signal.

20. The method according to claim 12, which performs digit by digit addition starting from the least significant digit of the first operand and the second operand.

21. The method according to claim 12, wherein n-bit augends and n-bit addends of the addition table defines the 2n-bit content symbols.

22. The method according to claim 12, wherein one of the corresponding pair of (n+1)-bit sum values is associated with the carry-in bit equal to 0 while the other of the corresponding pair of (n+1)-bit sum values is associated with the carry-in bit equal to 1.

* * * * *